(12) United States Patent
Kim et al.

(10) Patent No.: US 11,770,943 B2
(45) Date of Patent: *Sep. 26, 2023

(54) ORGANIC LIGHT EMITTING DIODE

(71) Applicant: SAMSUNG DISPLAY CO., LTD., Yongin-si (KR)

(72) Inventors: Dong Chan Kim, Gunpo-si (KR); Won Jong Kim, Suwon-si (KR); Dong Kyu Seo, Hwaseong-si (KR); Ji Hye Lee, Incheon (KR); Sang Hoon Yim, Suwon-si (KR); Won Suk Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 143 days.

This patent is subject to a terminal disclaimer.

(21) Appl. No.: 17/367,215

(22) Filed: Jul. 2, 2021

(65) Prior Publication Data

US 2021/0336178 A1 Oct. 28, 2021

Related U.S. Application Data

(63) Continuation of application No. 16/903,355, filed on Jun. 16, 2020, now Pat. No. 11,088,341, which is a (Continued)

(30) Foreign Application Priority Data

May 11, 2016 (KR) .......................... 10-2016-0057493

(51) Int. Cl.
*H10K 50/17* (2023.01)
*H10K 50/13* (2023.01)
(Continued)

(52) U.S. Cl.
CPC ........... *H10K 50/171* (2023.02); *H10K 50/13* (2023.02); *H10K 50/166* (2023.02); *H10K 50/00* (2023.02);
(Continued)

(58) Field of Classification Search
CPC . H01L 51/5092; H01L 51/504; H01L 51/508; H01L 51/50; H01L 51/5096;
(Continued)

(56) References Cited

U.S. PATENT DOCUMENTS 5,677,572 A 10/1997 Hung et al.
6,198,219 B1 3/2001 Arai et al.
(Continued)

FOREIGN PATENT DOCUMENTS

CN 1612647 A 5/2005
CN 103416106 A 11/2013
(Continued)

OTHER PUBLICATIONS

Schmitz, C., Pösch, P., Thelakkat, M., & Schmidt, H. W. (1999). Efficient screening of electron transport material in multi-layer organic light emitting diodes by combinatorial methods. Physical Chemistry Chemical Physics, 1(8), 1777-1781. (Year: 1999).*
(Continued)

*Primary Examiner* — Dawn L Garrett
(74) *Attorney, Agent, or Firm* — Lewis Roca Rothgerber Christie LLP

(57) ABSTRACT

According to an embodiment of the present disclosure, an organic light emitting diode includes: a first electrode; a second electrode overlapping the first electrode; an emission layer positioned between the first electrode and the second electrode; an electron injection layer positioned between the emission layer and the second electrode; and an electron injection delay layer positioned between the emission layer
(Continued)

and the electron injection layer, wherein the electron injection layer includes a first material made of a metal and a second material made of a metal halide, and the electron injection delay layer has a thickness of about 20 Å to about 140 Å.

19 Claims, 7 Drawing Sheets

Related U.S. Application Data continuation of application No. 15/352,513, filed on Nov. 15, 2016, now Pat. No. 10,749,129.

(51) Int. Cl.
*H10K 50/16* (2023.01)
*H10K 50/00* (2023.01)
*H10K 50/18* (2023.01)
*H10K 102/00* (2023.01)

(52) U.S. Cl.
CPC ..... *H10K 50/18* (2023.02); *H10K 2102/3026* (2023.02)

(58) Field of Classification Search
CPC ....... H01L 2251/5315; H01L 2251/301; H01L 51/5072; H01L 2251/55; H01L 2251/558; H10K 50/171; H10K 50/13; H10K 50/166; H10K 50/00; H10K 50/18; H10K 2102/3026; H10K 2102/00; H10K 50/16; H10K 2101/00; H10K 2102/351
See application file for complete search history.

(56) References Cited

U.S. PATENT DOCUMENTS

| | | | |
|---|---|---|---|
| 6,797,129 B2 | 9/2004 | Raychaudhuri et al. | |
| 7,071,615 B2 | 7/2006 | Lu et al. | |
| 7,411,223 B2 | 8/2008 | Liu et al. | |
| 8,659,011 B2 | 2/2014 | Yokoyama et al. | |
| 9,105,879 B2 | 8/2015 | Yokoyama et al. | |
| 10,749,129 B2 | 8/2020 | Kim et al. | |
| 11,088,341 B2 * | 8/2021 | Kim | H01L 51/504 |
| 2004/0070334 A1 | 4/2004 | Buckley et al. | |
| 2004/0124766 A1 | 7/2004 | Nakagawa et al. | |
| 2007/0254186 A1 | 11/2007 | Arakane et al. | |
| 2015/0069359 A1 | 3/2015 | Yoon et al. | |
| 2015/0200379 A1 | 7/2015 | Kim | |
| 2016/0141541 A1 | 5/2016 | Noda | |
| 2016/0149161 A1 | 5/2016 | Lee et al. | |
| 2016/0164018 A1 | 6/2016 | Lee et al. | |
| 2016/0248034 A1 | 8/2016 | Kim et al. | |
| 2016/0372714 A1 | 12/2016 | Kim | |

FOREIGN PATENT DOCUMENTS

| | | |
|---|---|---|
| KR | 10-1182447 B1 | 9/2012 |
| KR | 10-2015-0029530 A | 3/2015 |
| KR | 10-2016-0024349 A | 3/2016 |

OTHER PUBLICATIONS

Azim-Araghi et al., Acta Physica Polonica A, vol. 125 (2014), pp. 87-92. (Year: 2014).
A. Karaman et al., "Transferable Deformation-Dipole Model for Ionic Materials", Department of Physics, Instanbul University, Dec. 1, 2006, 5 pages, Instanbul, Turkey.
M. Abd El-Ghani Salem, "Studies on the Opto-Electronic Constants of Alkali-Halide Crystals", Turk J Phys 27 (2003), Physics Department, Azhar University, Jan. 30, 2002, pp. 569-577, Nasr-City, Cairo, Egypt.
Chih-I Wu et al., "Energy Structures and Chemical Reactions at the Al/LiF/Alq3 Interfaces Studied by Synchrotron-Radiation Photoemission Spectroscopy", AIP Publishing, Applied Physics Letters, vol. 87, Issue 21, 2005, http://dx.doi.org/10.1063/1.2135376.
Chang-Hwan Rhee, "Dissociation Energies and Dipole Moments of Alkali Halides", Journal of the Korean Chemical Society, Department of Chemistry, Kangwon National University, Jul. 3, 1997, pp. 449-459, vol. 41, No. 9, Chuncheon 200-701, Korea.
Zhanhua Wei et al., The Rise of Perovskite Light-Emitting Diodes, the Journal of Physical Chemistry Letters, 2019, pp. 3035-3042, vol. 10, ACS Publications.
Chinese Office Action dated Jun. 23, 2020, for corresponding Chinese Patent Application No. 201710329782.7 (9 pages).

* cited by examiner

ORGANIC LIGHT EMITTING DIODE

CROSS-REFERENCE TO RELATED APPLICATION

This application is a continuation of U.S. patent application Ser. No. 16/903,355, filed on Jun. 16, 2020, which is a continuation application of U.S. patent application Ser. No. 15/352,513, filed on Nov. 15, 2016, which claims priority to and the benefit of Korean Patent Application No. 10-2016-0057493, filed in the Korean Intellectual Property Office on May 11, 2016, the entire contents of all of which are incorporated herein by reference.

BACKGROUND

1. Field

The present disclosure relates to an organic light emitting diode.

2. Description of the Related Art

An organic light emitting diode is an element (e.g., a device) in which holes supplied from an anode and electrons supplied from a cathode are combined in an organic emission layer to form excitons, and light is emitted when the excitons drop from an excited state to a ground state (e.g., become stabilized).

The organic light emitting diode has several merits such as wide viewing angles, fast response speed, thin thickness, and lower power consumption such that the organic light emitting diode is widely applied to various electrical and electronic devices such as televisions, monitors, mobile phones, etc.

However, since the organic light emitting diode has low emission efficiency, a high driving voltage is required to obtain high luminance required of the display or a light (e.g., an emitted light), and resultantly, a lifespan of the element (e.g., the organic light emitting diode) may be shortened.

The above information disclosed in this Background section is only for enhancement of understanding of the background of the invention and therefore it may contain information that does not form the prior art that is already known in this country to a person of ordinary skill in the art.

SUMMARY

An aspect according to one or more embodiments of the present disclosure is directed toward an organic light emitting diode with improved emission efficiency.

According to an embodiment of the present disclosure, an organic light emitting diode includes: a first electrode; a second electrode overlapping the first electrode; an emission layer between the first electrode and the second electrode; an electron injection layer between the emission layer and the second electrode; and an electron injection delay layer between the emission layer and the electron injection layer, wherein the electron injection layer includes a reaction product of a first material including a metal and a second material including a metal halide, and the electron injection delay layer has a thickness from equal to or greater than 20 Å to equal to or less than 140 Å.

The electron injection delay layer may include a dielectric material having a band gap of 4 eV or more.

The electron injection delay layer may include at least one selected from the group consisting of LiF, NaF, KF, RbF, CsF, $MgF_2$, $CaF_2$, $SrF_2$, $BaF_2$, Liq, and $Alq_3$.

A valence electron number of the metal included in the first material may be equal to or greater than a valence electron number of the metal included in the second material.

The electron injection layer may include a first compound including the metal of the first material and the halide of the second material and a second compound including the metal of the first material and the metal halide of the second material.

The metal of the first material included in the first compound may be a bivalent element or a trivalent element.

The second compound may have a perovskite structure.

The first material may be a lanthanide metal.

The second material may be a metal iodide.

The metal iodide may include one selected from the group consisting of LiI, NaI, KI, RbI, CsI, $MgI_2$, $CaI_2$, $SrI_2$, and $BaI_2$.

In the electron injection layer, the first material may be distributed with a same volume as the second material or the first material may be distributed with a greater volume than the second material.

The electron injection layer may include a lower region where more first material is distributed than the second material and an upper region where more second material is distributed than the first material.

The amount of the first material may increase in a direction from the second electrode toward the electron injection delay layer in the electron injection layer.

The emission layer may emit white light by combining a plurality of layers.

The plurality of layers may include two light emission layers or three light emission layers.

The organic light emitting diode may further include an electron transport layer between the emission layer and the electron injection delay layer, and the electron transport layer may include an organic material.

An organic light emitting diode according to an exemplary embodiment of the present disclosure includes: a first electrode; a second electrode overlapping the first electrode; an emission layer between the first electrode and the second electrode; an electron injection layer between the emission layer and the second electrode; and an electron injection delay layer between the emission layer and the electron injection layer and configured to lower an electron injection speed, wherein the electron injection layer includes a reaction product of a first material including a metal and a second material including a metal halide, and a valence electron number of the metal included in the first material is equal to or greater than a valence electron number of the metal included in the second material.

The electron injection layer may include a first compound including the metal of the first material and the halide of the second material and a second compound including the metal of the first material and the metal halide of the second material.

The metal of the first material included in the first compound may be a bivalent element or a trivalent element.

The second compound may have a perovskite structure.

The first material may be a lanthanide metal.

The second material may be a metal iodide.

The metal iodide may include one selected from the group consisting of LiI, NaI, KI, RbI, CsI, $MgI_2$, $CaI_2$, $SrI_2$, and $BaI_2$.

The organic light emitting diode may further include an electron transport layer between the emission layer and the electron injection delay layer, and the electron transport layer may include an organic material.

According to an exemplary embodiment of the present disclosure, the charge balance is good such that the emission efficiency of the organic light emitting diode may be improved.

DETAILED DESCRIPTION

Figure 1:
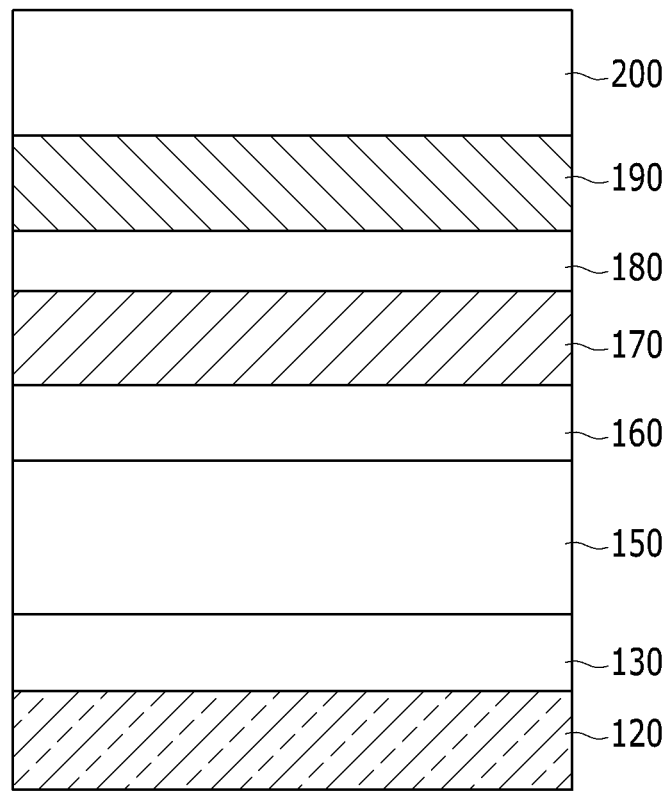
FIG. 1 is a schematic cross-sectional view of an organic light emitting diode according to an exemplary embodiment of the present disclosure.

Features and enhancements of the present invention will be described in more detail hereinafter with reference to the accompanying drawings, in which exemplary embodiments of the present invention are shown. As those skilled in the art would realize, the described embodiments may be modified in various different ways, all without departing from the spirit or scope of the present invention.

In order to clearly explain the present invention, a portion that is not directly related to the present invention may not be provided, and the same reference numerals refer to the same or similar constituent elements through the entire specification.

Further, in the drawings, the sizes and thicknesses of the components are exemplarily provided for convenience of description, and the present invention is not limited to those shown in the drawings. In the drawings, the thickness of layers, films, panels, regions, etc., may be exaggerated for clarity. In the drawings, the thickness of layers, films, panels, regions, etc., may be exaggerated for convenience of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" refers to positions on or below the object portion, and does not necessarily refer to a position on the upper side of the object portion based on a gravitational direction.

In addition, unless explicitly described to the contrary, the word "comprise" and variations thereof (such as "comprises" or "comprising") will be understood to imply the inclusion of the stated elements but not the exclusion of any other elements.

Further, in this specification, the phrase "on a plane" refers to viewing a target portion from the top, and the phrase "on a cross-section" refers to viewing a cross-section formed by vertically cutting a target portion from the side.

Expressions such as "at least one of" or "at least one selected from" when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

As used herein, the terms "substantially," "about," and similar terms are used as terms of approximation and not as terms of degree, and are intended to account for the inherent deviations in measured or calculated values that would be recognized by those of ordinary skill in the art. Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Figure 2:
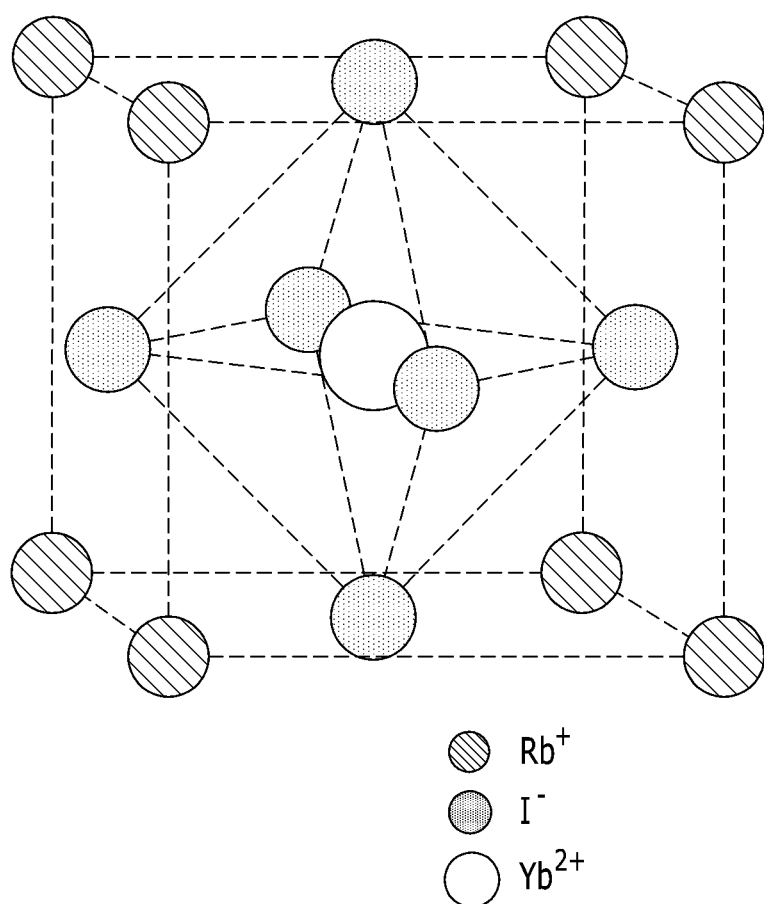
FIG. 2 is a schematic illustration showing a perovskite structure according to an exemplary embodiment of the present disclosure.

FIG. 1 is a schematic cross-sectional view of an organic light emitting diode according to an exemplary embodiment of the present disclosure. FIG. 2 is a schematic illustration showing a perovskite structure according to an exemplary embodiment of the present disclosure.

Referring to FIG. 1, an organic light emitting diode according to the present exemplary embodiment includes a first electrode 120 and a second electrode 190 overlapping each other, an emission layer 150 positioned between the first electrode 120 and the second electrode 190, a hole transport region 130 positioned between the first electrode 120 and the emission layer 150, an electron transport layer 160 positioned between the emission layer 150 and the second electrode 190, an electron injection layer 180 positioned between the electron transport layer 160 and the second electrode 190, an electron injection delay layer 170 positioned between the electron transport layer 160 and the electron injection layer 180, and a capping layer 200 positioned on the second electrode 190.

In the present exemplary embodiment, the first electrode 120 may be a reflecting electrode.

In the present disclosure, the reflecting electrode may be defined as an electrode including a material having a characteristic of reflecting light emitted from the emission layer 150 to be transmitted to the second electrode 190. The reflection characteristic may refer to a reflectivity of incident light that is about 70% or more to about 100% or less, or about 80% or more to about 100% or less.

The first electrode 120 may include silver (Ag), aluminum (Al), chromium (Cr), molybdenum (Mo), tungsten (W), titanium (Ti), gold (Au), palladium (Pd), or alloys thereof to be utilized as the reflection layer while having the anode function, and may have a triple layer structure of silver (Ag)/indium tin oxide (ITO)/silver (Ag) or indium tin oxide (ITO)/silver (Ag)/indium tin oxide (ITO).

The first electrode 120 may be formed by utilizing a sputtering method, a vapor phase deposition method, an ion beam deposition method, or an electron beam deposition method.

The hole transport region 130 may correspond to an auxiliary layer positioned between the first electrode 120 and the emission layer 150. The hole transport region 130 may include at least one of the hole injection layer and the hole transport layer. The hole injection layer facilitates injection of holes from the first electrode 120, and the hole transport layer performs a function of smoothly transporting the holes transmitted from the hole injection layer. The hole transport region 130 may be formed of a dual-layered structure in which the hole transport layer is disposed on the hole injection layer, or a single layer in which a material forming the hole injection layer and the material forming the hole transport layer are mixed.

The hole transport region 130 may include an organic material. For example, the hole transport region 130 may include NPD (N,N-dinaphthyl-N,N'-diphenyl benzidine), TPD (N, N'-bis-(3-methylphenyl)-N,N'-bis-(phenyl)-benzidine), spiro-TAD, and/or MTDATA (4,4',4"-tris(N-3-methylphenyl-N-phenyl-amino)-triphenylamine), but embodiments of the present disclosure are not limited thereto.

The emission layer 150 is positioned on the hole transport region 130. The emission layer 150 includes a light emitting material displaying a particular color. For example, the emission layer 150 may display a primary color such as blue, green, or red, or a combination thereof.

The thickness of the emission layer 150 may be in a range from 10 nm to 50 nm. The emission layer 150 may include a host and a dopant. The emission layer 150 may contain materials for emitting red, green, blue, and/or white light, and may be formed by utilizing a phosphorescent and/or fluorescent material.

When the emission layer 150 emits red light, the emission layer 150 may include a host material that includes CBP (4,4'-bis(carbazol-9-yl)-biphenyl) or mCP (1,3-bis(carbazol-9-yl) benzene), and may further include a phosphorescent material including at least one selected from PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium), and PtOEP (platinum octaethylporphyrin), or a fluorescent material including PBD: Eu(DBM)3(phen) or perylene, but embodiments of the present disclosure are not limited thereto.

When the emission layer 150 emits green light, the emission layer 150 may include a host material including CBP or mCP, and may further include a phosphorescent material including a dopant material including Ir(ppy)3 (fac-tris(2-phenylpyridine)iridium) or a fluorescent material including Alq3(tris(8-hydroxyquinolino)aluminum), but embodiments of the present disclosure are not limited thereto.

When the emission layer 150 emits blue light, the emission layer 150 may include a host material including CBP or mCP, and may further include a phosphorescent material including a dopant that includes (4,6-F2ppy)2Irpic. Alternatively, the emission layer 150 may include the host material having an anthracene group, and may further include a fluorescent material including the dopant including a diamine group or at least one selected from spiro-DPVBi, spiro-6P, distyrylbenzene (DSB), distyrylarylene (DSA), a PFO-based polymer, and a PPV-based polymer, but embodiments of the present disclosure are not limited thereto.

The electron transport layer 160 and the electron injection layer 180 are positioned between the emission layer 150 and the second electrode 190. The electron transport layer 160 is positioned to be adjacent to the emission layer 150, and the electron injection layer 180 is positioned to be adjacent to the second electrode 190.

The electron transport layer 160 may include an organic material. For example, the electron transport layer 160 may be made of at least one selected from $Alq_3$ (tris(8-hydroxyquinolino)aluminum), PBD (2-[4-biphenyl-5-[4-tert-butylphenyl]]-1,3,4-oxadiazole), TAZ (1,2,4-triazole), spiro-PBD(spiro-2-[4-biphenyl-5-[4-tert-butylphenyl]]-1,3, 4-oxadiazole), BAlq (8-hydroxyquinoline aluminum salt; for example, 8-hydroxyquinoline aluminum salt may be bis(2-methyl-8-quinolinolato-N1,O8)-(1,1'-biphenyl-4-olato)-aluminum), and 8-hydroxyquinoline beryllium salt, however embodiments of the present disclosure are not limited thereto.

The electron transport layer 160 may transmit the electrons from the second electrode 190 to the emission layer 150. Also, the electron transport layer 160 may reduce or prevent the holes injected from the first electrode 120 from being moved into the second electrode 190 through the emission layer 150. That is, the electron transport layer 160 has a function of a hole blocking layer and helps with the combination of the holes and the electrons in the emission layer 150.

The electron injection layer 180 has a function of improving the electron injection from the second electrode 190 to the electron transport layer 160. In the present exemplary embodiment, the electron injection layer 180 may include a reaction product of a first material made of (e.g., including or consisting of) a metal and a second material made of (e.g., including or consisting of) a metal halide. The first material may be a lanthanide metal, and the second material may be halides of Group 1 elements or Group 2 elements, for example, the second material may be a metal iodide.

In the present exemplary embodiment, the thickness of the electron injection layer 180 may be in a range from about 2 Å to about 25 Å by considering a process margin.

In the present exemplary embodiment, the first material and the second material may include metals having standard electrode potentials that are similar to each other. For example, when the first material and the second material include any one among Group 1 elements, Group 2 elements, and lanthanide elements, generation of a spontaneous reaction due to strong reactivity has been experimentally confirmed.

Experimental Example

Through this experiment, the first material made of the lanthanide elements such as ytterbium (Yb), europium (Eu), thulium (Tm), and/or samarium (Sm) and the second material made of the metal iodide such as RbI (rubidium iodide) and/or CsI (cesium iodide) are combined and co-deposited, and the first material and the second material are reacted (e.g., spontaneously reacted while being co-deposited), thereby forming the layer (e.g., the electron injection layer).

In this case, a result that the conductivity rises (increases) while the layer becomes transparent occurs. However, instead of the above, if the first material made of silver (Ag) and the second material made of the metal iodide such as RbI and/or CsI are combined and co-deposited to form the layer (e.g., the electron injection layer), the layer is not transparent and the conductivity does not rise (increase). Also, when combining and co-depositing the first material made of the lanthanide elements such as Yb, Eu, Tm, and/or Sm and the second material made of CuI to be reacted to form the layer (e.g., the electron injection layer), the layer is not transparent and the conductivity does not rise (increase). Accordingly, according to embodiments of the present disclosure, the metals included in the first material and the second material are materials having high reactivity to induce the spontaneous reaction.

Among the halide compounds, an iodine compound has low electron affinity of iodine itself and low electronegativity, thus it is easy for the iodine compound to be dissociated to form an iodine vacancy or be combined with other reactive metals to generate a new compound. Accordingly, the electron injection characteristic may be improved by the compounds generated by a substitution reaction of the first material made of the metal and the second material made of the metal iodide including iodine.

Also, since iodine has a small refractive index difference with the organic material compared to fluorine, it is enhanced (e.g. advantageous) for optical design. Further, since iodine has a low thermal evaporation temperature compared to the material such as fluorine, a process characteristic is enhanced (e.g. advantageous). In addition, if fluorine is pyrolyzed, a gas is emitted such that a vacuum degree (in the processing chamber) is decreased, however, even though heat is applied to iodine, it remains solid and there is no problem of the decreasing vacuum degree.

A conduction mechanism will be described below.

In the present exemplary embodiment, the metal included in the first material and the metal included in the second material may be substituted with each other. In this case, a valence electron number of the first material may be equal to or greater than a valence electron number of the metal included in the second material. If the valence electron number of the metal included in the first material is greater than the valence electron number of the metal included in the second material, the conductivity due to the free electrons that are additionally generated may be improved.

Also, if the halogen elements included in the second material are moved into (e.g., combined with) the first material to form a new material, free electrons are formed due to a halogen vacancy, such that conductivity may be improved.

Also, conductivity may be improved by the remaining metal ions that participate in the reaction (between the first material and the second material).

In the present exemplary embodiment, the electron injection layer 180 (e.g., the reaction product forming the electron injection layer 180) may include a first compound made of (e.g., including or consisting of) the metal of the first material and the halide of the second material and a second compound made of (e.g., including or consisting of) the metal of the first material and the metal halide of the second material. In this case, in the first compound, the metal of the first material may be a bivalent element or a trivalent element. The second compound may have a perovskite structure.

For example, the first material may be Yb, and the second material may be RbI. If RbI and Yb are co-deposited or the deposition is performed by utilizing each material, the chemical reaction is generated, thereby generating at least one among $YbI_2$, $YbI_3$, and $RbYbI_3$. Here, $RbYbI_3$, as shown in FIG. 2, may have the perovskite structure. In this way, although the chemical reaction is generated, the remaining material also exists as RbI.

The electron injection layer 180 according to the present exemplary embodiment may be a single-layered structure in which the first material and the second material are co-deposited. In the electron injection layer 180, if the first material is more greatly distributed (e.g., has a greater volume fraction) than the second material, the conductivity may be relatively increased or the transmittance may be relatively reduced compared with the opposite case (e.g., where the second material has a greater volume fraction than the first material). However, embodiments of the present disclosure are not limited thereto, the second material may be more greatly distributed compared with the first material in the electron injection layer 180. Accordingly, in the present exemplary embodiment, a degree (volume) at which the first material and the second material are distributed may be enhanced (e.g., optimized) by considering the sheet resistance and transmittance required of the organic light emitting diode. Also, the first material and the second material included in the electron injection layer 180 may be substantially distributed with the same volume.

In the present exemplary embodiment, the electron injection delay layer 170 is positioned between the electron transport layer 160 and the electron injection layer 180. The electron injection delay layer 170 has a function of reducing or preventing the electron injection layer 180 according to the present exemplary embodiment from very quickly moving the electrons transmitted from the second electrode 190 into the emission layer 150.

The electron injection delay layer 170 includes a dielectric material having a band gap of 4 eV or more. In this case, the electron injection delay layer 170 may include at least one selected from LiF, NaF, KF, RbF, CsF, $MgF_2$, $CaF_2$, $SrF_2$, $BaF_2$, Liq, and $Alq_3$. However, if heat is applied, the process characteristic is decreased for LiF, or the oxidation is easily generated and the vacuum (in the processing chamber) is decreased for $CaF_2$. Therefore, according to an embodiment of the present disclosure, the materials (such as NaF, KF, RbF, CsF, $MgF_2$, $SrF_2$, $BaF_2$, Liq, and $Alq_3$) except for LiF and $CaF_2$ are utilized in the electron injection delay layer 170.

TABLE 1

|  | Red | | Blue | |
| --- | --- | --- | --- | --- |
|  | Driving voltage | Emission efficiency | Driving voltage | Emission efficiency |
| Comparative Example 1 | 5.5 | 50 | 4.2 | 123 |
| Comparative Example 2 | 5.9 | 18 | 4.8 | 115 |
| Comparative Example 3 | 5.5 | 52 | 4.3 | 128 |
| Reference Example 1 | 5.4 | 25.3 | 4.1 | 130 |
| Exemplary Embodiment 1 | 4.6 | 55.2 | 3.8 | 142 |
| Exemplary Embodiment 2 | 4.5 | 57.4 | 3.7 | 148 |
| Exemplary Embodiment 3 | 4.2 | 61.3 | 3.5 | 152 |
| Exemplary Embodiment 4 | 4.3 | 60.2 | 3.8 | 149 |
| Exemplary Embodiment 5 | 4.5 | 57.2 | 3.9 | 148 |
| Exemplary Embodiment 6 | 4.7 | 55.1 | 4.0 | 145 |
| Reference Example 2 | 5.3 | 23.2 | 4.5 | 110 |

In Table 1, the organic light emitting diode is manufactured to have the cathode including AgMg to measure the driving voltage and the emission efficiency in red and blue elements.

In Table 1, Comparative Example 1 has the electron injection layer including Yb at about 13 Å, Comparative Example 2 has the electron injection layer at the thickness of about 13 Å obtained by co-depositing RbI and Yb, and Comparative Example 3 has the electron injection layer including LiF at about 10 Å. Reference example 1, Reference example 2, and Exemplary Embodiment 1 to Exemplary Embodiment 6 each have the electron injection layer at the thickness of about 13 Å obtained by co-depositing RbI and Yb and the electron injection delay layer 170 positioned to be adjacent to the electron transport layer 160. In this case, the electron injection delay layer 170 utilizes Liq.

In Reference Example 1 and Reference Example 2, the thickness of the electron injection delay layer 170 is 10 Å and 150 Å, respectively, and compared with Comparative Example 1, Comparative Example 2, and Comparative Example 3, the driving voltage is slightly reduced and the emission efficiency is rather poor.

In Exemplary Embodiment 1 to Exemplary Embodiment 6, the thickness of the electron injection delay layer 170 is 30 Å, 50 Å, 70 Å, 90 Å, 110 Å, and 130 Å, respectively.

In Exemplary Embodiment 1 to Exemplary Embodiment 6 in which the thickness of the electron injection delay layer 170 has the range of about 20 Å to about 140 Å (considering the processing margin), compared with Comparative Example 1 to Comparative Example 3, it may be confirmed that the driving voltage is reduced and the emission efficiency is improved. According to an embodiment of the present disclosure, the thickness of the electron injection delay layer 170 may be in the range from about 30 Å to about 130 Å.

The second electrode 190 is positioned on the electron injection layer 180. The second electrode 190 may be a transflective electrode.

In the present disclosure, the transflective electrode may be defined as an electrode including a material having a transflective characteristic transmitting part of the light incident to the second electrode 190 and reflecting a remaining part of the light to the first electrode 120. Here, the transflective characteristic may refer to that the reflectivity for the incident light is about 0.1% or more to about 70% or less, or about 30% or more to about 50% or less.

The second electrode 190 may include silver (Ag), magnesium (Mg), aluminum (Al), chromium (Cr), molybdenum (Mo), tungsten (W), titanium (Ti), gold (Au), palladium (Pd), ytterbium (Yb), or one or more alloys thereof.

When the above-described second electrode 190 is formed of the alloy, an alloy ratio is controlled by a temperature of a deposition source, an atmosphere, and a vacuum degree, and may be selected as an appropriate ratio. In the present exemplary embodiment, the second electrode 190 may have a thickness from about 50 Å (angstroms) to about 150 Å. If the thickness of the second electrode 190 is smaller than 50 Å, it is difficult to obtain the sheet resistance, while if the thickness is greater than 150 Å, the reflectance is increased without a wide angle distribution (WAD) such that a color change may be generated when being viewed from the side.

In the present exemplary embodiment, the second electrode 190 may be formed of AgMg, a content of Ag included in the second electrode 190 may be over 50 atomic % (at %), and Ag may be more abundant than Mg.

The capping layer 200 is positioned on the second electrode 190, and may be formed of an organic material or an inorganic material and may have a function of protecting the second electrode 190 or guiding a change of resonance intensity and resonance phase along with the second electrode 190.

As described above, the organic light emitting diode according to the present exemplary embodiment has the electron injection layer 180 including the reaction product of the first material made of the metal and the second material made of the metal halide. The metal halide may be the metal iodide.

Here, if a voltage is applied to the first electrode 120 and the second electrode 190, the metal iodide of an ion combination state is aligned into positive charges/negative charges depending on the electric field inside a dipole thin film (the electron injection layer in the present exemplary embodiment) by the electric field. The electrons-holes symmetrized in the interface of the electron transport layer 160 and the second electrode 190 based on the dipole thin film are coupled with a dipole surface, and excess electrons and holes by the amount offset for the voltage maintaining exist in the interface. In this case, like RbI included in the electron injection layer 180 according to the present exemplary embodiment, in a case of a polarized molecule having a dipole moment without the electric field, as the value of the dipole moment is greater, the coupled amount in the interface is increased and the amount of the electrons and the holes existing in the interface is greater. Particularly, the interface of the electron transport layer 160 including the organic material in which the holes are gathered to be charged with the positive charges is realized as a base (space) where the electrons are absent, and this may lead to many electrons moving into the vacancies. In this case, a vacuum level of the interface of the electron transport layer 160 is shifted (lowering a LUMO level) such that the injection barrier is lowered. Additionally, the introduced metal having the work function of less than 4.0 eV such as Yb has the function to make the interface charged with the positive charges due to a characteristic of an electron donor such that the electron injection characteristic may be further improved.

However, a charge balance is lower due to the excessively improved electron injection performance such that there is a problem that the emission efficiency relatively falls (is lowered), and in the present exemplary embodiment, the electron injection delay layer 170 is introduced to align (e.g., control the electron injection and maintain) the charge balance.

Figure 3:
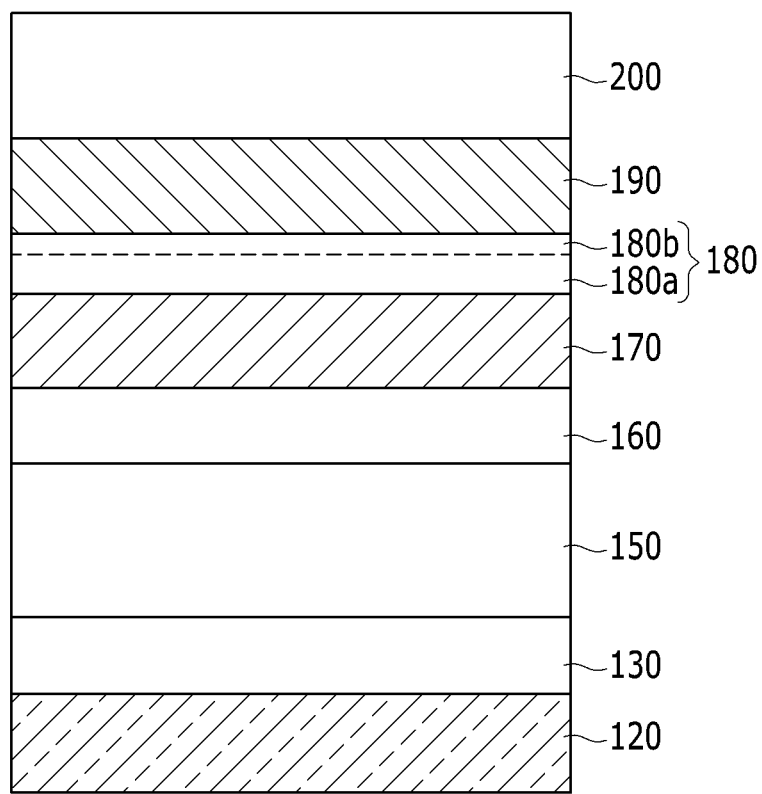
FIG. 3 is a schematic cross-sectional view showing an exemplary variation of an electron injection layer structure in the exemplary embodiment of FIG. 1.

FIG. 3 is a schematic cross-sectional view showing an exemplary variation of an electron injection layer structure in the exemplary embodiment of FIG. 1.

Referring to FIG. 3, most configurations are the same as those of the exemplary embodiment of FIG. 1, and like the exemplary embodiment of FIG. 1, the electron injection layer 180 includes a reaction product of the first material made of the metal and the second material made of the metal halide. However, in the present exemplary embodiment, the electron injection layer 180 also includes a lower region 180a and an upper region 180b, the first material is more greatly distributed than the second material in the lower region 180a (e.g., more first material than the second material is present in the lower region 180a), and the second material is more greatly distributed than the first material in the upper region 180b (e.g., more second material than the first material is present in the upper region 180b). The first material is substituted and reacted with the metal included in the second material or a new compound is generated in the border where the lower region 180a and the upper region 180b meet and its surrounding (areas) such that the conductive material may be formed.

This conductive material may include the free electrons and the metal ions. For example, when RbI and Yb are reacted, RbI and Yb are substituted such that $YbI_2$ and/or $YbI_3$ is formed, or the material having the perovskite structure such as $RbYbI_3$ may be formed. In this case, as $Rb^+$ is substituted with $Yb^{2+}$ or $Yb^{3+}$, the conductivity may be improved by the generated free electrons (the free electrons due to the iodine vacancy), and/or the metal ions (such as $Rb^+$, $Yb^{2+}$, and $Yb^{3+}$).

The electron injection layer 180 according to the present exemplary embodiment may be formed as follows. A lower layer made of the first material is formed on the electron injection delay layer 170, and an upper layer made of the second material is formed on the lower layer. In this case, the first material of the lower layer and the second material of the upper layer are respectively diffused without additional heat treatment, and the first material and the second material are reacted, thereby forming the layer having transparency and conductivity.

The exemplary description of the first material and the second material described in association with FIG. 1 may be applied to the present exemplary embodiment.

Figure 4:
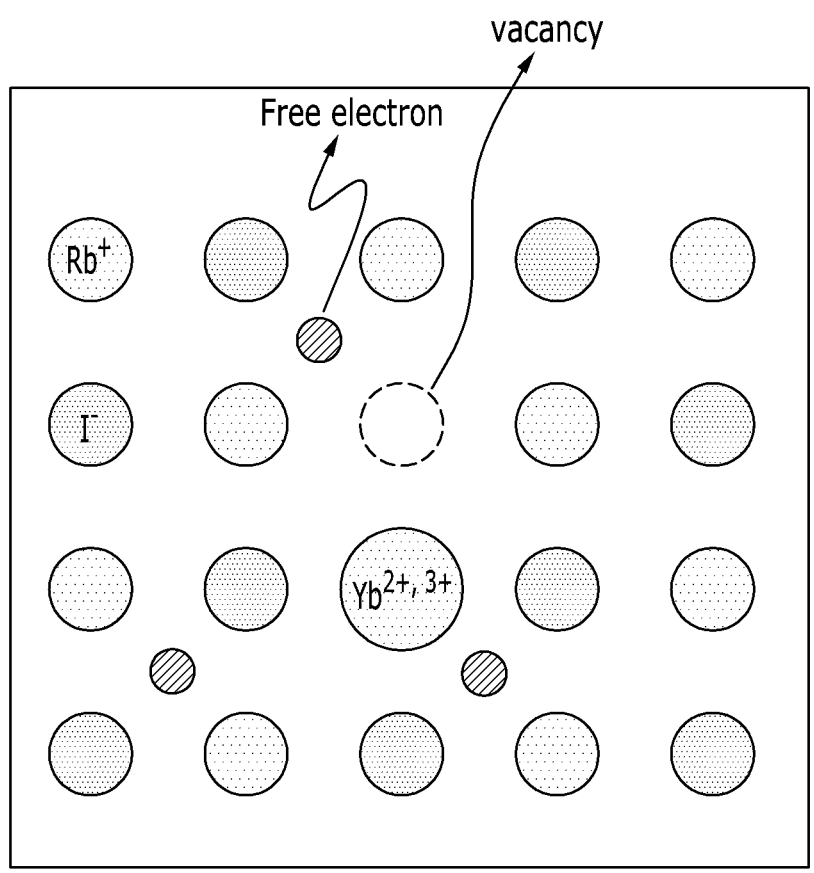
FIG. 4 is a schematic illustration showing an electron injection layer having free electrons according to an exemplary embodiment of the present disclosure.

FIG. 4 is a schematic illustration showing an electron injection layer having free electrons according to an exemplary embodiment of the present disclosure.

Referring to FIG. 4, one layer may be formed by utilizing Yb included in the first material and RbI included in the second material. Yb and RbI may be reacted, thereby forming the conductor, and in more detail, Rb and Yb are substituted with each other, resultantly one or two free electrons may be formed somewhere in the reactant, or one or two free electrons may be formed by the iodine vacancy generated as the $YbI_2$ or $YbI_3$ compound is formed. In this way, because of the free electron formed by RbI (that is one kind of the metal halide) and/or the free electron formed by the iodine vacancy, and the metal ion, the electron injection layer 180 according to the present exemplary embodiment may have the conductivity of which the electron injection speed is very fast.

Figure 5:
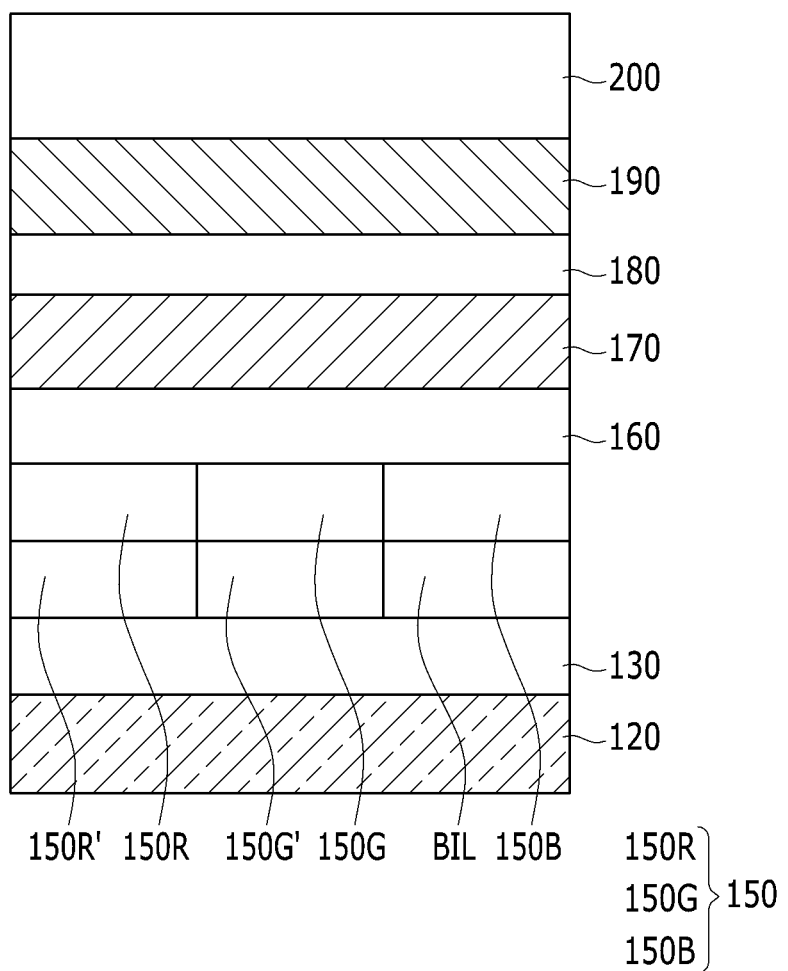
FIG. 5 is a schematic cross-sectional view showing an exemplary embodiment incorporating an emission layer of the exemplary embodiment of FIG. 1.

FIG. 5 is a schematic cross-sectional view showing an exemplary embodiment incorporating an emission layer of the exemplary embodiment of FIG. 1.

Referring to FIG. 5, the emission layer 150 of FIG. 1 includes a red emission layer 150R, a green emission layer 150G, and a blue emission layer 150B, and they are horizontally disposed in the direction parallel to the first electrode 120. Among the red emission layer 150R, the green emission layer 150G, and the blue emission layer 150B, a pixel definition layer may be positioned between adjacent emission layers.

In the present exemplary embodiment, an auxiliary layer BIL to increase the efficiency of the blue emission layer 150B may be positioned under the blue emission layer 150B, and the auxiliary layer BIL may have a function of increasing the efficiency of the blue emission layer 150B by controlling a hole charge balance. The auxiliary layer BIL may include a compound represented by Chemical Formula 1.

zothiophenyl, dibenzofuranyl (DBF), or biphenyl, and a, b, and c are each an integer selected from zero to four.

Examples of the compounds represented by Chemical Formula 1 include the Chemical Formulas 1-1, 1-2, 1-3, 1-4, 1-5, and 1-6.

Chemical Formula 1-1

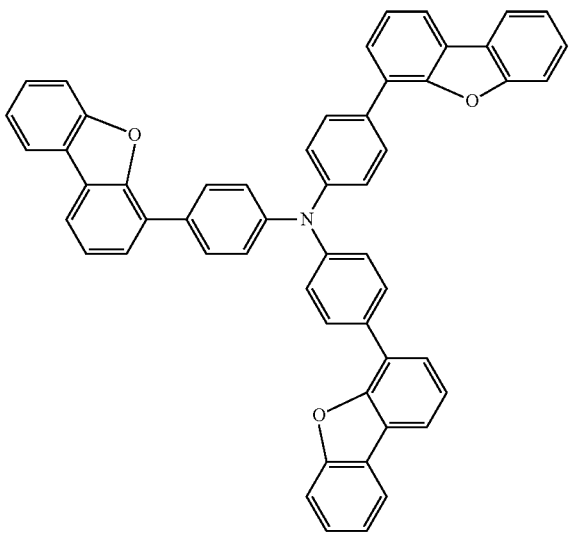

Chemical Formula 1

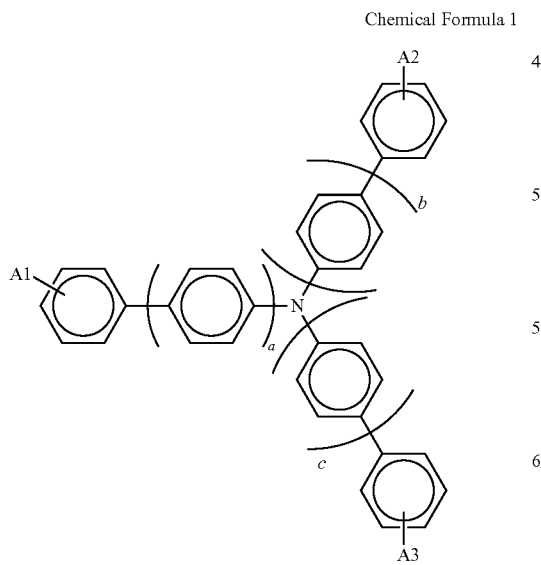

In Chemical Formula 1, A1, A2, and A3 are each independently an alkyl group, an aryl group, carbazolyl, diben- Chemical Formula 1-2

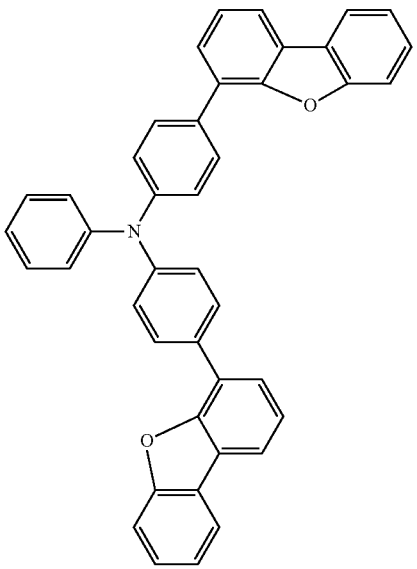

Chemical Formula 1-3

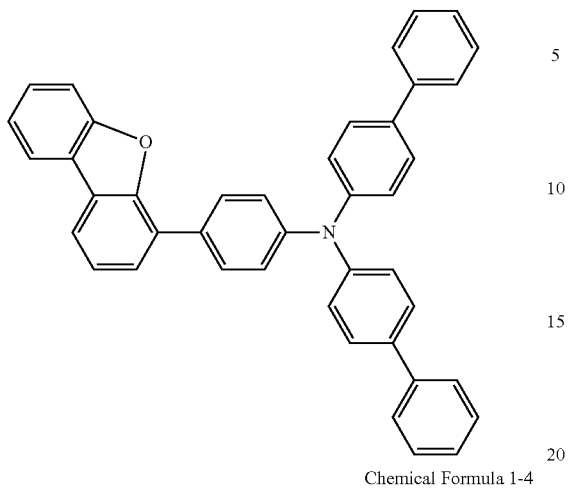

Chemical Formula 1-4

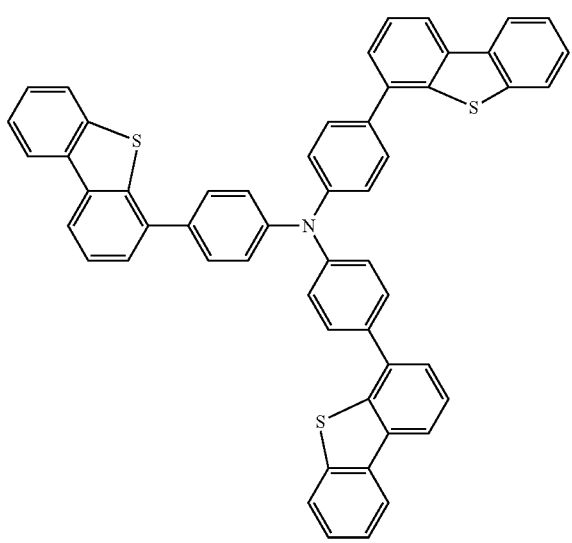

Chemical Formula 1-5

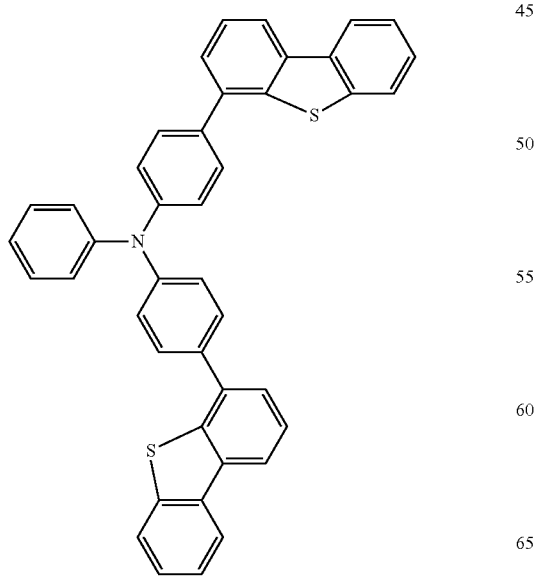

Chemical Formula 1-6

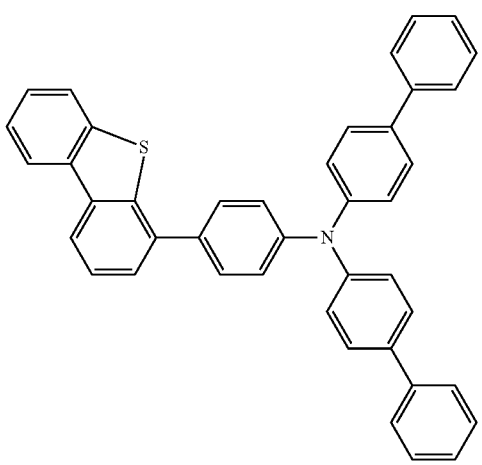

In another exemplary embodiment, the auxiliary layer (BIL) may include a compound represented by Chemical Formula 2.

Chemical Formula 2

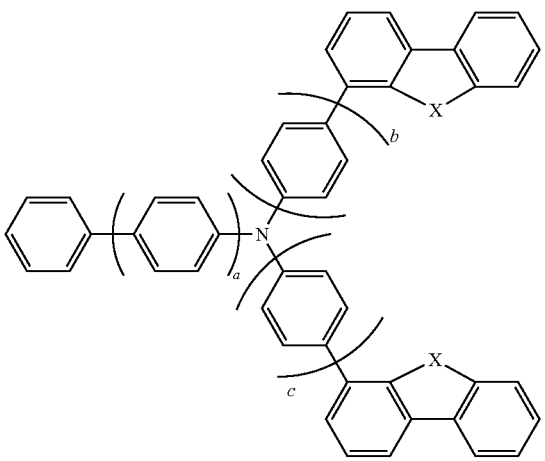

In Chemical Formula 2, a, b and c may respectively be an integer selected from 0 to 3, X may be O, N, or S, and each X may be the same as or different from the other.

Examples of the compound represented by Chemical Formula 2 include Chemical Formulas 2-1, 2-2, 2-3, 2-4, and 2-5.

Chemical Formula 2-1
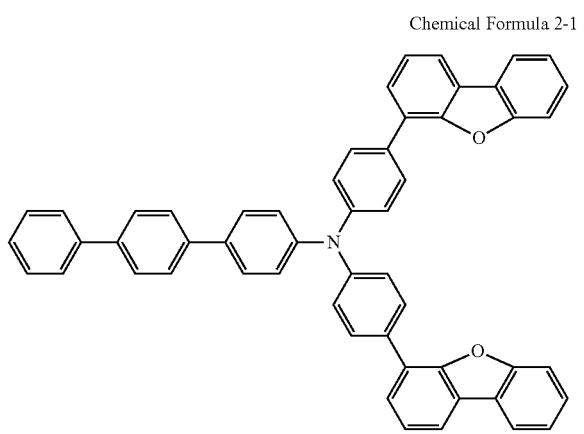
Chemical Formula 2-2
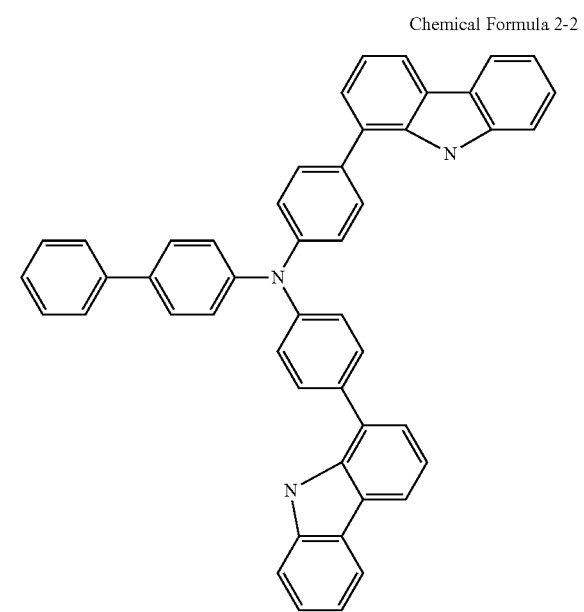
Chemical Formula 2-3
Chemical Formula 2-4
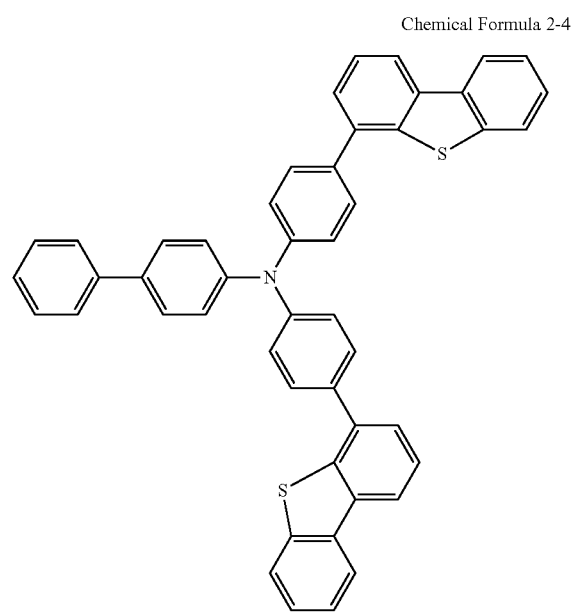

Chemical Formula 2-5

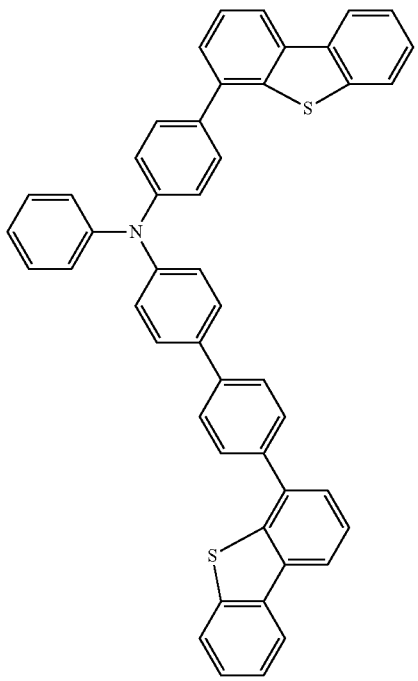

In another exemplary embodiment, the auxiliary layer (BIL) may include a compound represented by Chemical Formula 3.

Chemical Formula 3

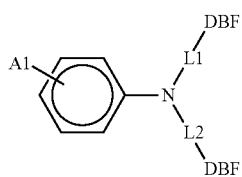

In Chemical Formula 3, A1 may be an alkyl group, an aryl group, carbazolyl, dibenzothiophenyl, or dibenzofuranyl (DBF), L1 and L2 may be

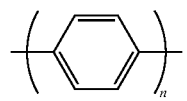

(wherein n is an integer selected from 0 to 3), and DBF connected to L1 and L2 may be each independently replaced by carbazolyl or dibenzothiophenyl.

In the organic light emitting diode according to the present exemplary embodiment, a red resonance auxiliary layer 150R' may be positioned under the red emission layer 150R, and a green resonance auxiliary layer 150G' may be positioned under the green emission layer 150G. The red resonance auxiliary layer 150R' and the green resonance auxiliary layer 150G' are added to control a resonance distance for each color. In one embodiment, a separate resonance auxiliary layer positioned between the blue emission layer 150B and the auxiliary layer BIL, and between the auxiliary layer BIL and the hole transport region 130, may not be formed under the blue emission layer 150B and the auxiliary layer BIL.

Figure 6:
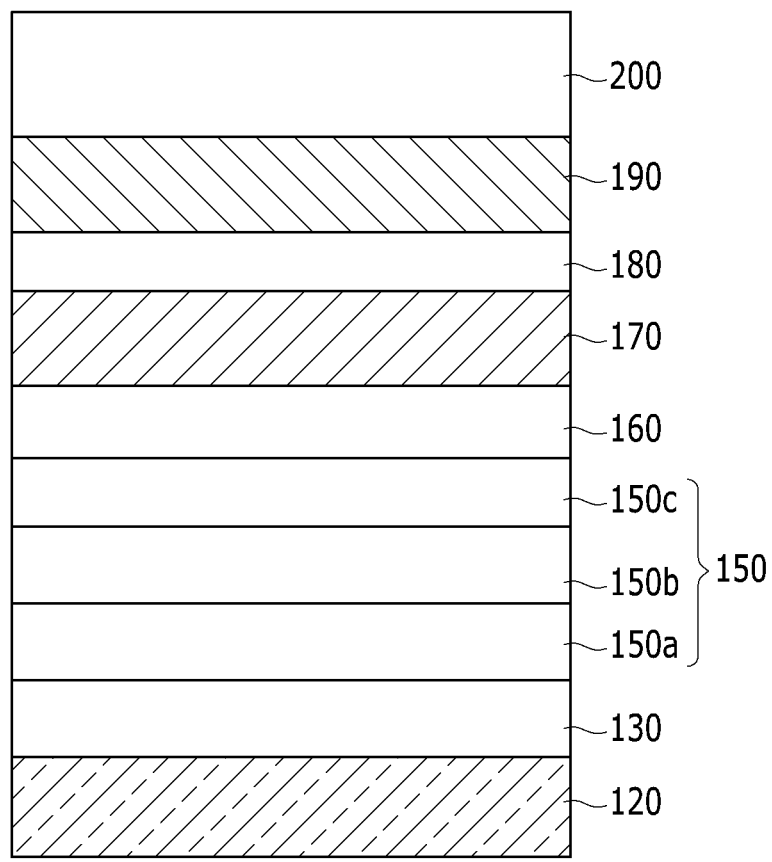
FIG. 6 is a schematic cross-sectional view showing an exemplary variation of an emission layer according to the exemplary embodiment of FIG. 5.

FIG. 6 is a schematic cross-sectional view showing an exemplary variation of an emission layer according to the exemplary embodiment of FIG. 5.

Most of the configurations of FIG. 6 are the same as those of the organic light emitting diode described in FIG. 1. Next, differences from the exemplary embodiment of FIG. 1 will be described, and the contents described with reference to FIG. 1 may all be applied to the exemplary embodiment of FIG. 6.

Referring to FIG. 6, the organic light emitting diode according to the present exemplary embodiment includes the emission layer 150 emitting the white light by combining a plurality of layers 150a, 150b, and 150c representing different colors. The plurality of layers may be a structure in which two light emission layers or three light emission layers are deposited, and the emission layer 150 of three light emission layers is shown in FIG. 6.

Three layers of the emission layer 150 may respectively represent blue, yellow, and blue (e.g., blue emission layer, yellow emission layer and blue emission layer), and although not shown, two layers of the emission layer may respectively represent blue and yellow (e.g., blue emission layer and yellow emission layer). Although not shown, at least one charge generating layer may be positioned between adjacent layers among the plurality of layers 150a, 150b, and 150c of FIG. 6.

The description related to the electron injection layer 180 and the electron injection delay layer 170 shown in FIG. 1 may also be applied to the organic light emitting diode of FIG. 6.

Figure 7:
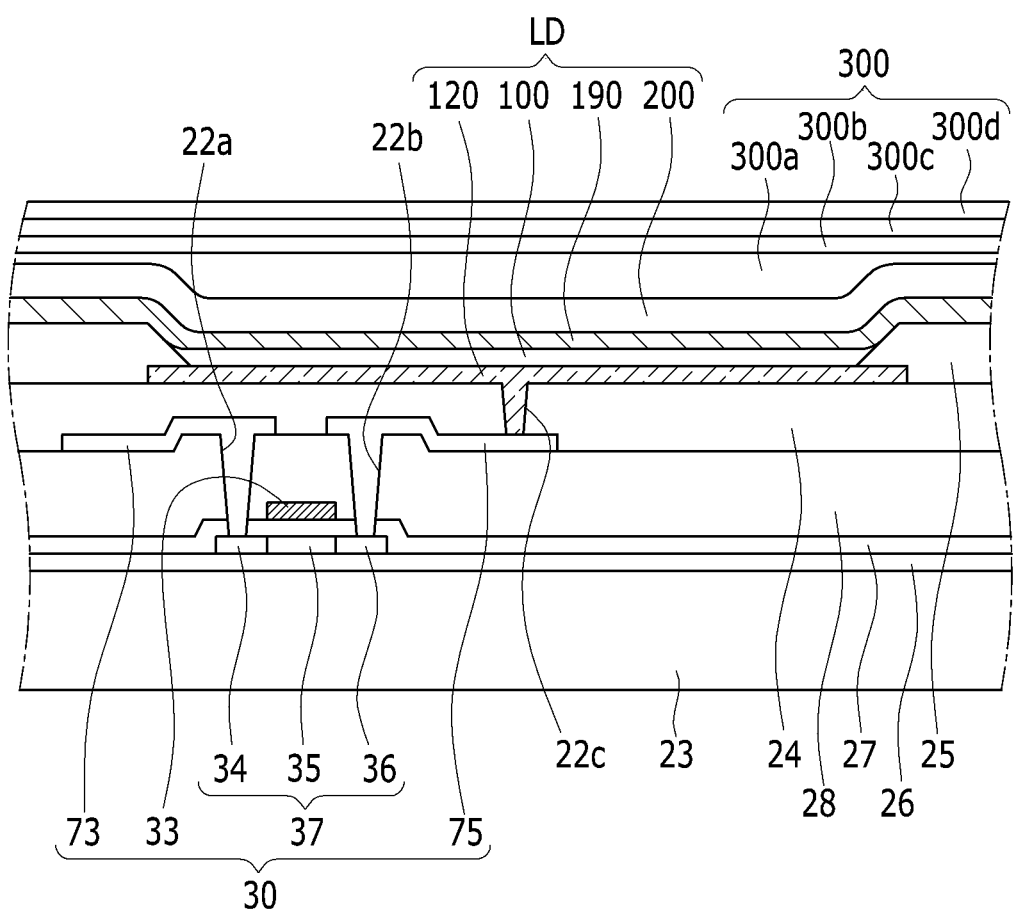
FIG. 7 is a schematic cross-sectional view showing an organic light emitting device according to an exemplary embodiment of the present disclosure.

FIG. 7 is a schematic cross-sectional view showing an organic light emitting diode display according to an exemplary embodiment of the present disclosure.

Referring to FIG. 7, the organic light emitting diode display according to an exemplary embodiment of the present disclosure includes a substrate 23, a driving thin film transistor 30, a first electrode 120, a light-emitting element layer 100, and a second electrode 190. The first electrode 120 may be the anode and the second electrode 190 may be the cathode, however the first electrode 120 may be the cathode and the second electrode 190 may be the anode.

A substrate buffer layer 26 may be positioned on the substrate 23. The substrate buffer layer 26 serves to reduce or prevent penetration of impure elements and to planarize the surface, however, the substrate buffer layer 26 is not a necessary configuration, and may not be included according to kind and process conditions of the substrate 23.

A driving semiconductor layer 37 is formed on the substrate buffer layer 26. The driving semiconductor layer 37 may be formed of a material including a polysilicon. Also, the driving semiconductor layer 37 includes a channel region 35 not doped with an impurity, and a source region 34 and a drain region 36 doped with an impurity (e.g., an ion material) at respective sides of the channel region 35. The doped ion materials may be P-type impurities such as boron (B), and $B_2H_6$ may be generally utilized. The impurities depend on the kind of the thin film transistor.

A gate insulating layer 27 is positioned on the driving semiconductor layer 37. A gate wire including a driving gate electrode 33 is positioned on the gate insulating layer 27. The driving gate electrode 33 overlaps at least a portion of the driving semiconductor layer 37, particularly, the channel region 35.

An interlayer insulating layer 28 covering the driving gate electrode 33 is formed on the gate insulating layer 27. A first contact hole 22a and a second contact hole 22b that expose the source region 34 and the drain region 36 of the driving semiconductor layer 37 are formed in the gate insulating layer 27 and the interlayer insulating layer 28. A data wire including a driving source electrode 73 and a driving drain electrode 75 may be positioned on the interlayer insulating layer 28. The driving source electrode 73 and the driving drain electrode 75 are respectively connected to the source region 34 and the drain region 36 of the driving semiconductor layer 37 through the first contact hole 22a and the second contact hole 22b formed in the interlayer insulating layer 28 and the gate insulating layer 27.

As described above, the driving thin film transistor 30 (including the driving semiconductor layer 37, the driving gate electrode 33, the driving source electrode 73, and the driving drain electrode 75) is formed. The configuration of the driving thin film transistor 30 is not limited to the aforementioned example, and may be variously modified to have a suitable configuration as apparent to those skilled in the art.

In addition, a planarization layer 24 covering the data wire is formed on the interlayer insulating layer 28. The planarization layer 24 serves to remove and planarize a step in order to increase emission efficiency of the organic light emitting diode to be formed thereon. Also, the planarization layer 24 has a third contact hole 22c to electrically connect the driving drain electrode 75 and the first electrode 120 that is to be described later.

This exemplary embodiment of the present disclosure is not limited to the above-described configuration, and one of the planarization layer 24 and the interlayer insulating layer 28 may not be included in some cases.

A first electrode 120 of the organic light emitting diode LD is positioned on the planarization layer 24. A pixel definition layer 25 is positioned on the planarization layer 24 and the first electrode 120. The pixel definition layer 25 has an opening overlapping a part of the first electrode 120. The light-emitting element layer 100 may be positioned in each opening formed in the pixel definition layer 25.

On the other hand, the light-emitting element layer 100 is positioned on the first electrode 120. The light-emitting element layer 100 corresponds to the hole transport region 130, the emission layer 150, the electron transport layer 160, the electron injection delay layer 170, and the electron injection layer 180 in the organic light emitting diode described in FIG. 1.

A second electrode 190 and a capping layer 200 are positioned on the light-emitting element layer 100.

A thin film encapsulation layer 300 is positioned on the capping layer 200. The thin film encapsulation layer 300 encapsulates the organic light emitting diode LD and the driving circuit unit formed on the substrate 23 from the outside to protect them.

The thin film encapsulation layer 300 includes encapsulation organic layers 300a and 300c and encapsulation inorganic layers 300b and 300d that are alternately deposited one by one. In FIG. 7, the thin film encapsulation layer 300 is configured by alternately depositing two encapsulation organic layers 300a and 300c and two encapsulation inorganic layers 300b and 300d one by one, as an example, however embodiments of the present disclosure are not limited thereto.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting diode comprising:
a first electrode;
a second electrode overlapping the first electrode;
an emission layer between the first electrode and the second electrode;
a third layer between the emission layer and the second electrode;
a second layer between the emission layer and the third layer, wherein the second layer comprises at least one selected from the group consisting of LiF, NaF, KF, RbF, CsF, $MgF_2$, $CaF_2$, $SrF_2$, $BaF_2$, Liq, and $Alq_3$; and
a first layer comprising an organic material, wherein the first layer is between the emission layer and the second layer,
wherein the first layer is in contact with the emission layer and in contact with the second layer, and
wherein the third layer comprises a metal and a metal halide.

2. The organic light emitting diode of claim 1, wherein the second layer comprises a dielectric material.

3. The organic light emitting diode of claim 2, wherein the dielectric material has a band gap of 4 eV or more.

4. The organic light emitting diode of claim 1, wherein the second layer has a thickness from equal to or greater than 20 Å to equal to or less than 140 Å.

5. The organic light emitting diode of claim 1, wherein a valence electron number of the metal is equal to or greater than a valence electron number of a metal in the metal halide.

6. The organic light emitting diode of claim 1, wherein the metal is a bivalent element or a trivalent element.

7. The organic light emitting diode of claim 1, wherein the metal is a lanthanide metal.

8. The organic light emitting diode of claim 1, wherein the metal halide is a metal iodide.

9. The organic light emitting diode of claim 8, wherein the metal iodide comprises one selected from the group consisting of LiI, NaI, KI, RbI, CsI, $MgI_2$, $CaI_2$, $SrI_2$, and $BaI_2$.

10. The organic light emitting diode of claim 1, wherein in the third layer, the metal is distributed the same as the metal halide or the metal is distributed greater than the metal halide.

11. The organic light emitting diode of claim 1, wherein the emission layer includes a plurality of layers.

12. The organic light emitting diode of claim 11, wherein each layer of the plurality of layers respectively is configured to emit blue or yellow light.

13. The organic light emitting diode of claim 12, wherein the emission layer is to emit white light by combining the plurality of layers.

14. The organic light emitting diode of claim 13, wherein the plurality of layers comprises two light emission layers or three light emission layers.

15. The organic light emitting diode of claim 1, wherein the third layer includes a lower region where more of the metal than the metal halide is distributed and an upper region where more of the metal halide than the metal is distributed.

16. The organic light emitting diode of claim 1, wherein an amount of the metal increases in a direction from the second electrode toward the second layer in the third layer.

17. The organic light emitting diode of claim 1, wherein the third layer is transparent.

18. The organic light emitting diode of claim 1, wherein the third layer consists of the metal and the metal halide.

19. The organic light emitting diode of claim 1, wherein the second electrode includes at least one selected from the group consisting of Ag and Mg.

* * * * *